United States Patent
Pavlovic

[11] Patent Number: 6,055,158
[45] Date of Patent: Apr. 25, 2000

[54] ELECTRONIC COMPONENT HEAT SINK ASSEMBLY

[75] Inventor: Slobodan Pavlovic, Canton, Mich.

[73] Assignee: Framatome Connectors Interlock, Inc., Westland, Mich.

[21] Appl. No.: 09/270,552

[22] Filed: Mar. 16, 1999

[51] Int. Cl.[7] .................................................. H05K 7/20
[52] U.S. Cl. ...................... 361/704; 361/701; 361/709; 361/713; 361/714; 361/719; 257/706; 257/712; 257/721; 257/722; 174/16.1; 174/16.3; 165/80.2; 165/80.3
[58] Field of Search ..................... 361/688, 690, 361/689, 702–704, 707, 709, 718–721; 257/706, 713, 718, 719, 720–722, 796; 174/16.1, 16.3; 165/80.2, 80.3, 185

[56] References Cited

U.S. PATENT DOCUMENTS

| | | | |
|---|---|---|---|
| 5,287,001 | 2/1994 | Buchmann et al. | 257/719 |
| 5,296,739 | 3/1994 | Heilbronner et al. | 257/687 |
| 5,305,185 | 4/1994 | Samarov et al. | 361/704 |
| 5,339,215 | 8/1994 | Nishiguchi | 361/704 |
| 5,402,313 | 3/1995 | Casperson et al. | 361/710 |
| 5,461,541 | 10/1995 | Wentland, Jr. et al. | 361/707 |
| 5,469,330 | 11/1995 | Karabatsos et al. | 361/704 |
| 5,801,330 | 9/1998 | Gademann et al. | 174/52.1 |
| 5,812,375 | 9/1998 | Casperson | 361/707 |

FOREIGN PATENT DOCUMENTS

| | | |
|---|---|---|
| 0340520 | 11/1989 | European Pat. Off. . |
| 0350588 | 2/1995 | European Pat. Off. . |

*Primary Examiner*—Leo P. Picard
*Assistant Examiner*—Boris L. Chervinsky
*Attorney, Agent, or Firm*—Perman & Green, LLP

[57] ABSTRACT

An electronic component heat sink assembly comprising a printed circuit board having electronic components; and a box surrounding the printed circuit board. The box has a first box member with a molded plastic frame and a heat transfer member connected to the molded plastic frame. The frame of the first box member can also form part of an electrical header connector. The heat transfer member extends through the molded plastic frame and has portions which extend from different sides of the molded plastic frame. The portions of the heat transfer member extend from a first one of the sides of the molded plastic frame and are thermally connected to the electronic components such that heat from the electronic components is transferred out of the box, through the molded plastic frame, by the heat transfer member.

15 Claims, 3 Drawing Sheets

ELECTRONIC COMPONENT HEAT SINK ASSEMBLY

BACKGROUND OF THE INVENTION

1. Field of the Invention

The present invention relates to an electronic circuit assembly and, more particularly, to an assembly with a heat sink.

2. Prior Art

U.S. Pat. No. 5,402,313 discloses an electronic component heat sink assembly with springs which act against electronic components. EP 0350588 discloses a heat sink attached to an electronic component which has spaced fins and pliant legs. Technology of automotive electronic boxes comprising heat dissipative components consists of a metallic box; preferably aluminum. The metallic box comprises pads having a height such that the pads come into contact with components to be cooled. Traditionally the components are soldered on a printed circuit board (PCB) and the PCB is attached to the metallic box. Problems exist with this type of technology. The pads of the metallic box need to be machined with high precision for high precision positioning. The box is relatively heavy and expensive because it is made of aluminum. Header connectors in the prior art have to be attached to the metallic box using potting/sealing compounds during a secondary (additional) assembly process. This increases the cost of the assembly and decreases reliability of the sealing fixture.

SUMMARY OF THE INVENTION

In accordance with one embodiment of the present invention an electronic component heat sink assembly is provided comprising a printed circuit board arid a box surrounding the printed circuit board. The printed circuit board has electronic components. The box has a first box member with a molded plastic frame and a heat transfer member connected to the molded plastic frame. Header connectors can be formed as an integral part of the plastic frame. The heat transfer member extends through the molded plastic frame and has portions which extend from different sides of the molded plastic frame. The portions of the heat transfer member which extend from a first side of the molded plastic frame are thermally connected to the electronic components such that heat from the electronic components is transferred out of the box, through the molded plastic frame, by the heat transfer member.

In accordance with another embodiment of the present invention a heat sink and box enclosure piece for forming an electronic component heat sink assembly is provided. The piece comprises a frame and a heat transfer member extending through the frame. The frame is comprised of molded plastic. The heat transfer member has a first portion extending from a first side of the frame and a second portion extending from a second side of the frame. The first portion is deflectable upon contact with an electrical component on a printed circuit board of the assembly. The heat transfer member transfers heat from the first portion, through the molded plastic frame, to the second portion of the heat transfer member.

In accordance with one method of the present invention a method of manufacturing an electronic box assembly is provided comprising the steps of providing a heat transfer member; molding a first plastic box frame piece onto the heat transfer member, portions of the heat transfer member extending from different sides of the first frame piece; locating a printed circuit board in a second plastic box frame piece; and connecting the first frame piece to the second frame piece with first ones of the portions of the heat transfer member extending from a first one of the different sides of the first frame piece and contacting components on the printed circuit board for heat transfer.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
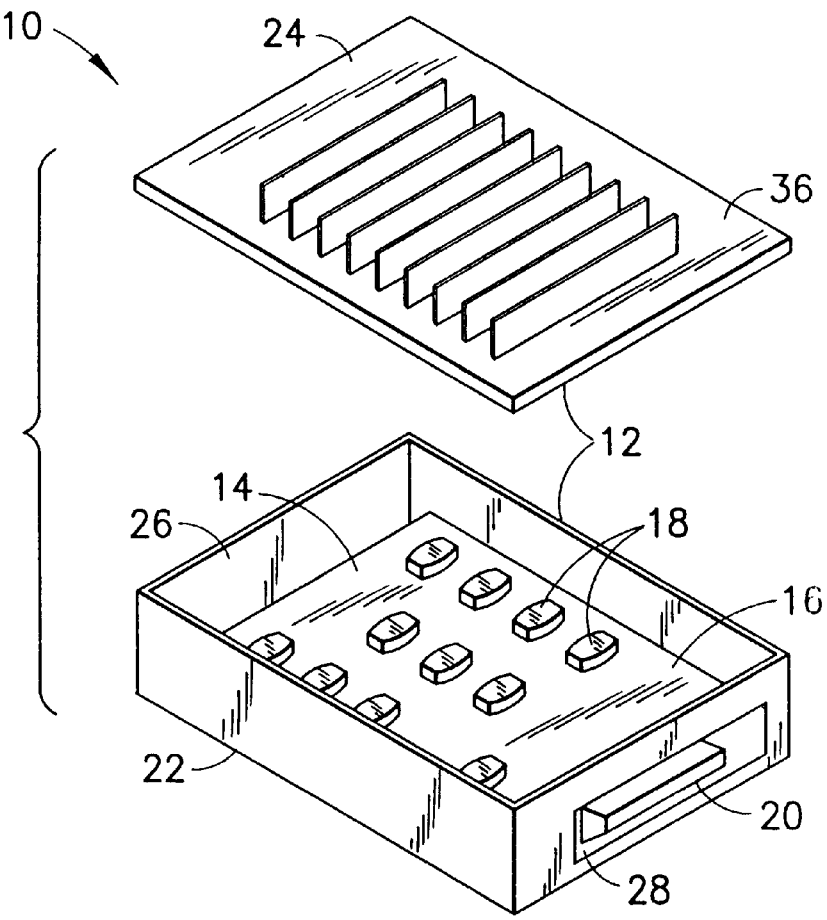
FIG. 1 is an exploded perspective view of an electronic assembly incorporating features of the present invention.

Referring to FIG. 1, there is shown an exploded perspective view of an electronic assembly 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The assembly 10 generally comprises a box enclosure 12 and a printed circuit board 14. The printed circuit board 14 generally comprises a circuit member 16, electronic components 18 and an electrical connector 20. The circuit member 16 can be rigid or flexible. The electronic components 18 can include any suitable type of component, such as a semiconductor chip. The electronic components 18 and connector 20 are mounted to the circuit member 16. The electrical connector 20 allows the printed circuit board 14 to be connected to other components (not shown) such as electrical and electronic components in an automobile.

Figure 2:
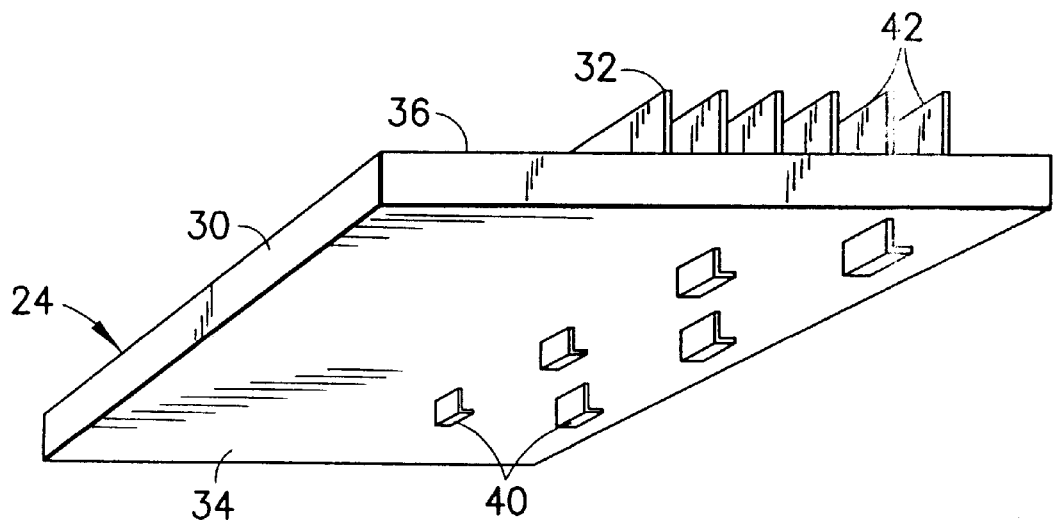
FIG. 2 is a perspective of the bottom side of the lid shown in FIG. 1.
Figure 3:
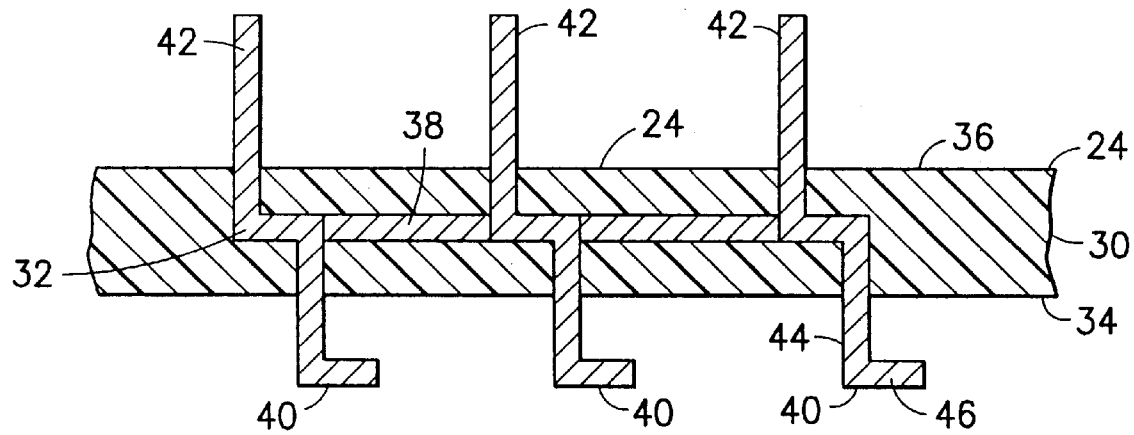
FIG. 3 is a partial cross-sectional view of the lid shown in FIG. 2.

The box 12 generally comprises a second box member or base 22 and a first box member or lid 24. The base 22 and/or lid 24 may be comprised of multiple pieces. The base 22 has a receiving area 26 and an aperture 28. The printed circuit board 14 is located in the receiving area 26. The electrical connector 20 is located at the aperture 28. The base 22 is preferably comprised of a molded plastic or polymer material. The lid 24 is adapted to be mounted to the base 22 to enclose the printed circuit board in the receiving area 26. Referring also to FIGS. 2 and 3, the lid 24 generally comprises a frame 30 and at least one heat transfer member 32 connected to the frame 30. The frame 30 is preferably comprised of a molded plastic or polymer material. The frame 30 has a first side 34 intended to face towards the printed circuit board 14 and an opposite second side 36. The heat transfer member 32 generally comprises a center section 38 and portions 40, 42 which extend from opposite sides of the center section 38. In a preferred embodiment the heat transfer member is comprised of flat sheet metal that has been cut and formed. The heat transfer member 32 is comprised of a thermally conductive material, such as aluminum. The frame 30 is preferably insert molded over the center section 38 to encase the center section 38 in plastic. In alternate embodiments the frame 30 could be over molded onto the heat transfer member 32 or other means could be used to fixedly connect the heat transfer member 32 to the frame 30. The first portions 40 of the heat transfer member 32 form cold fingers which extend from the first side 34 of the frame 30. The first portions 40, in this embodiment, have a general L-shape with a leg section 44 and a foot section 46. The leg sections 44 are preferably resiliently deformable or deflectable. Thus, a plurality of separately and independently deflectable cold fingers extend from the first side 34 of the frame 30 as illustrated in FIG. 2. The leg sections 44 could have different heights from each other depending upon the heights of their respective electronic components 18 intended to be contacted with their respective feet 46. The second portions 42 extend from the opposite second side 36 of the frame 30. In this embodiment the second portions comprise heat transfer cooling fins for radiating heat into surrounding air.

Figure 4:
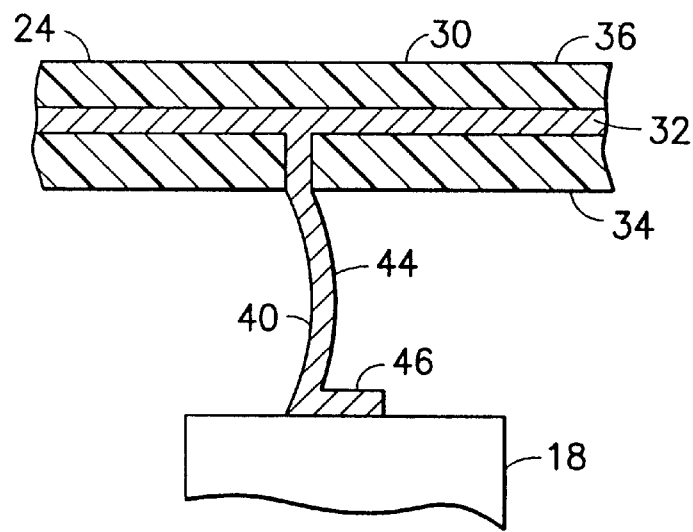
FIG. 4 is an enlarged partial cross-sectional view of the lid as shown in FIG. 3 contacting one of the electronic components of the printed circuit board.

Referring also to FIG. 4, one of the first portions 40 is shown connected to one of the electronic components 18. Preferably, the bottom of the foot 46 is attached to the top of the electronic component 18 by thermally conductive adhesive. When the lid 24 is attached to the base 22 the feet 46 contact the electronic components 18. Not all the components 18 need be directly contacted by the feet 46. The legs 44 can deflect or bend to accommodate differences in heights among the top sides of the components 18. Thus, very precise manufacturing of the lengths of the legs 44 is not necessary because the lengths of the legs 44 can automatically adjust by the legs 44 bending as necessary. In alternate embodiments other shapes could be provided for the first portions 40, but the heights of the first portions 40 are preferably variable or automatically adjustable. Thus, co-planitary problems between the components 18 and the heat transfer member 32 are reduced.

The printed circuit board 14 is mounted to the heat transfer member 32 in order to remove heat from the electronic components 18. The electronic components 18 can generate heat during operation. Heat can decrease the working life of the printed circuit board 14. The assembly 10 could also be used in an environment which generates heat, such as in an engine compartment of an automobile. Thus, by providing the box 12 with the member 32, heat can be removed from the electronic components 18 to increase the reliability and the working life of the printed circuit board 14; especially from heat peaks or spikes. With the first portions 40 contacting the electronic components 18, heat can be transferred from the electronic components 18 to outside the box 12. More specifically, heat is transferred to the first portions 40, through the center section 38, and to the second portions 42. Thus, heat is transferred through the frame 30 by the heat transfer member 32 from the area 26 to the air outside the box 12. The lid 24 could have multiple heat transfer members attached to it. The base 22 could also have heat transfer member(s) attached to it which contact electrical components on the printed circuit board. The heat transfer element(s) could be integrally formed with the base 22 rather than the lid 24. The present invention replaces the old metallic box with a plastic box, such as in low heat dissipating applications, and to insert-mold or overmold in this plastic box a dissipator system comprising a grid having on one side radiator ribs and on the other side finger elements adapted to contact the components. Since the fingers are not massive pads as in the prior art, the fingers could be shaped as resilient elements which would reduce the needs of high precision positioning, contrary of the prior art massive pads which need a very precise height positioning of the components on the PCB or intermediate layers of heat conductive compound. This solution allows also weight and cost reduction.

Figure 5:
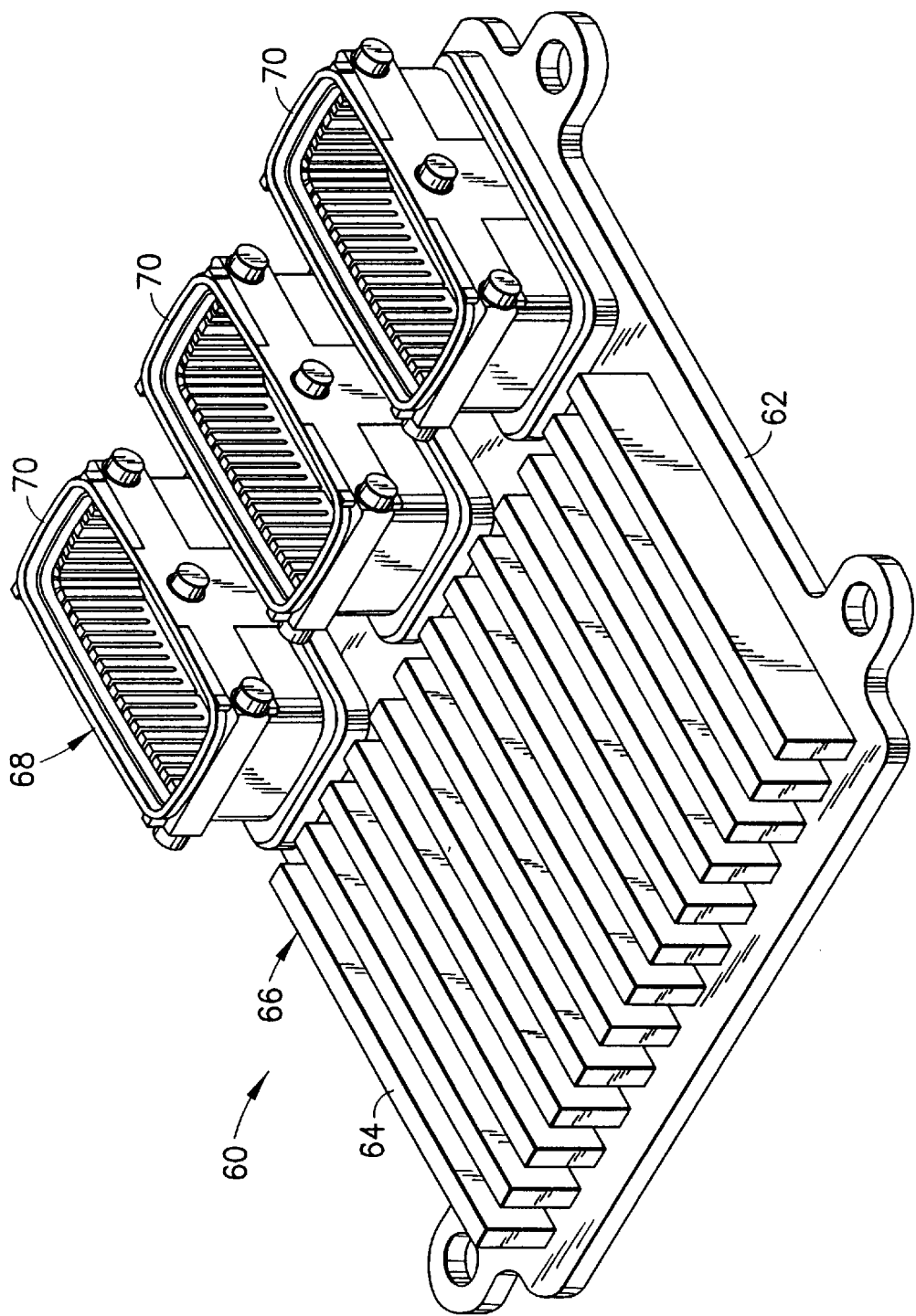
FIG. 5 is a perspective view of an alternate embodiment of the present invention.

Referring now to FIG. 5, a perspective view of a top side of an alternate embodiment is shown. The lid 60 generally comprises a frame 62 and heat transfer members 64 connected to the frame 62. The frame 62 is preferably comprised of a molded plastic or polymer material. Preferably the frame 62 is molded onto the heat transfer members 64 with portions of the heat transfer members extending from opposite top and bottoms sides of the frame similar to the embodiment shown in FIGS. 2–4. The lid 60 has a first section 66 with the heat transfer members 64 and a second section 68. The second section 68 comprises portions 70 with form parts of electrical connectors. In this embodiment the portions 70 form parts of housings for electrical connectors, such as headers. The electrical contacts can be fixedly mounted to the portions 70 after the portions 70 are molded. Alternatively, the electrical contacts could be preassembled with another housing component which is subsequently mounted to the portions 70. In an alternate embodiment the frame 62 could be molded directly onto electrical contacts of the electrical connectors or directly onto other connector housing components having the electrical contacts therein. Thus, electrical connectors (or at least a portion thereof) can be formed as an integral part of the lid or box.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electronic component heat sink assembly comprising:

a printed circuit board having electronic components; and a box surrounding the printed circuit board, the box having a first box member with a molded plastic frame and a heat transfer member connected to the molded plastic frame, the heat transfer member extending through the molded plastic frame and having portions which extend from different sides of the molded plastic frame, wherein the portions of the heat transfer member extending from a first one of the sides of the molded plastic frame are thermally connected to the electronic components such that heat from the electronic components is transferred out of the box, through the molded plastic frame, by the heat transfer member, and wherein the heat transfer member is fixedly connected to the frame by the frame being molded onto the heat transfer member.

2. An electronic component heat sink assembly as in claim 1 wherein the box has a second box member with a molded plastic frame connected to the first box member.

3. An electronic component heat sink assembly as in claim 1 wherein the portions of the heat transfer member extending from the first side of the frame are deflectable and deflect upon contact with the electronic components.

4. An electronic component heat sink assembly as in claim 3 wherein the portions of the heat transfer member extending from a second one of the sides of the molded plastic frame comprise heat transfer fins.

5. An electronic component heat sink assembly as in claim 4 wherein the portions of the heat transfer member extending from the first side of the frame comprise multiple separately and independently deflectable members.

6. An electronic component heat sink assembly as in claim 5 wherein the heat transfer member comprises a middle section between and connecting the portions extending from the first and second sides of the frame, wherein the middle section is encapsulated by the frame.

7. An electronic component heat sink assembly as in claim 1 wherein the portions of the heat transfer member extending from a second one of the sides of the molded plastic frame comprise heat transfer fins.

8. An electronic component heat sink assembly as in claim 1 wherein the heat transfer member comprises a middle section between and connecting the portions extending from the different sides of the frame, wherein the middle section is encapsulated by the frame.

9. An electronic component heat sink assembly as in claim 1 wherein the portions of the heat transfer member extending from the first side of the frame comprise multiple separately and independently deflectable members.

10. A heat sink and box enclosure piece for forming an electronic component heat sink assembly, the piece comprising:
   a frame comprised of molded plastic; and
   a heat transfer member extending through the frame, the heat transfer member having a first portion extending from a first side of the frame and a second portion extending from a second side of the frame,
   wherein the first portion is deflectable upon contact with an electrical component on a printed circuit board of the assembly and the heat transfer member transfers heat from the first portion, through the molded plastic frame, to the second portion of the heat transfer member.

11. A heat sink and box enclosure piece as in claim 10 wherein the second portion of the heat transfer member extending from the second side of the frame comprises heat transfer fins.

12. A heat sink and box enclosure piece as in claim 10 wherein the first portion of the heat transfer member extending from the first side of the frame comprises multiple separately and independently deflectable members.

13. A heat sink and box enclosure piece as in claim 10 wherein the heat transfer member comprises a middle section between and connecting the first and second portions which is encapsulated by the frame.

14. A heat sink and box enclosure piece as in claim 10 wherein the heat transfer member is fixedly connected to the frame by the frame being molded onto the heat transfer member.

15. A box enclosure for housing an electronic component, the box enclosure comprising:
   a first box member;
   a second box member connectable to the first box member to form a receiving area for at least partially housing the electronic component; and
   a heat transfer member connected at a connection with the first box member, the connection comprising a section of the heat transfer member being encasement captured by the first box member to fixedly connect the heat transfer member to the first box member and form a seal between the section and the first box member, and wherein portions of the heat transfer member extend out of at least two sides of the first box member.

* * * * *